(12) United States Patent
Wilson et al.

(10) Patent No.: US 7,528,458 B2
(45) Date of Patent: May 5, 2009

(54) PHOTODIODE HAVING INCREASED PROPORTION OF LIGHT-SENSITIVE AREA TO LIGHT-INSENSITIVE AREA

(75) Inventors: Robin Wilson, Holywood (GB); Conor Brogan, Belfast (GB); Hugh J. Griffin, Newtownabbey (GB); Cormac MacNamara, Belfast (GB)

(73) Assignee: Icemos Technology Ltd., Belfast (GB)

( * ) Notice: Subject to any disclaimer, the term of this patent is extended or adjusted under 35 U.S.C. 154(b) by 41 days.

(21) Appl. No.: 11/681,576

(22) Filed: Mar. 2, 2007

(65) Prior Publication Data

US 2007/0205478 A1 Sep. 6, 2007

Related U.S. Application Data

(60) Provisional application No. 60/778,480, filed on Mar. 2, 2006.

(51) Int. Cl.
*H01L 31/075* (2006.01)
*H01L 31/00* (2006.01)

(52) U.S. Cl. .................. 257/458; 257/443; 257/466
(58) Field of Classification Search .............. 257/443, 257/458, 466, E31.061; 438/48
See application file for complete search history.

(56) References Cited

U.S. PATENT DOCUMENTS

| 3,648,131 | A | 3/1972 | Stuby |
| 5,051,803 | A * | 9/1991 | Kitamura et al. ............. 257/53 |
| 5,998,292 | A | 12/1999 | Black et al. |
| 6,087,719 | A | 7/2000 | Tsunashima |
| 6,329,679 | B1 | 12/2001 | Park |
| 6,426,991 | B1 | 7/2002 | Mattson et al. |
| 6,762,473 | B1 | 7/2004 | Goushcha et al. |
| 6,831,367 | B2 | 12/2004 | Sekine |
| 7,038,288 | B2 * | 5/2006 | Lai et al. .................... 257/448 |
| 7,439,599 | B2 * | 10/2008 | Gao et al. .................... 257/443 |
| 2006/0027934 | A1 | 2/2006 | Edelstein et al. |

FOREIGN PATENT DOCUMENTS

| WO | 2005001941 A2 | 1/2005 |
| WO | 2005031880 A1 | 4/2005 |

\* cited by examiner

*Primary Examiner*—Hung Vu
(74) *Attorney, Agent, or Firm*—Panitch Schwarze Belisario & Nadel LLP

(57) ABSTRACT

A photodiode having an increased proportion of light-sensitive area to light-insensitive area includes a semiconductor having a backside surface and a light-sensitive frontside surface. The semiconductor includes a first active layer having a first conductivity, a second active layer having a second conductivity opposite the first conductivity, and an intrinsic layer separating the first and second active layers. A plurality of isolation trenches are arranged to divide the photodiode into a plurality of cells. Each cell has a total frontside area including a cell active frontside area sensitive to light and a cell inactive frontside area not sensitive to light. The cell active frontside area forms at least 95 percent of the cell total frontside area. A method of forming the photodiode is also disclosed.

13 Claims, 5 Drawing Sheets

PHOTODIODE HAVING INCREASED PROPORTION OF LIGHT-SENSITIVE AREA TO LIGHT-INSENSITIVE AREA

CROSS-REFERENCE TO RELATED APPLICATIONS

This application claims priority to U.S. Provisional Patent Application No. 60/778,480, filed on Mar. 2, 2006, entitled "Photodiode Having Increased Proportion of Light-Sensitive Area to Light-Insensitive Area."

BACKGROUND OF THE INVENTION

Embodiments of the present invention relate to a positive-intrinsic-negative (PIN) or negative-intrinsic-positive (NIP) photodiode array and a method for manufacturing a PIN/NIP photodiode array.

Positive-intrinsic-negative (PIN) photodiodes (or "PIN diodes") are known in the art. A PIN photodiode includes a lightly doped intrinsic region sandwiched between more heavily p-doped and n-doped semiconducting regions which function as anode and cathode, respectively. A sensor surface of the PIN photodiode is typically coated with an oxide or nitride passivation layer. The PIN diode's name derives from the order of the layering of the positive, intrinsic, and negative (P-I-N) materials.

Broadly speaking, a photodiode is a semiconductor device that converts light to electrical current. A PIN diode typically exhibits an increase in its electrical conductivity as a function of the intensity, wavelength, and modulation rate of the incident radiation.

BRIEF SUMMARY OF THE INVENTION

Briefly stated, an embodiment of the present invention comprises a photodiode having an increased proportion of light-sensitive area to light-insensitive area. The photodiode includes a semiconductor having a backside surface and a light-sensitive frontside surface. The semiconductor includes a first active layer having a first conductivity, a second active layer having a second conductivity opposite the first conductivity, and an intrinsic layer separating the first and second active layers. A plurality of isolation trenches are arranged to divide the photodiode into a plurality of cells. Each cell has a total frontside area including a cell active frontside area sensitive to light and a cell inactive frontside area not sensitive to light. The cell active frontside area forms at least 95 percent of the cell total frontside area.

Another embodiment of the present invention comprises a method of manufacturing a photodiode having an increased proportion of light-sensitive area to light-insensitive area. The method includes the step of providing a semiconductor having a frontside surface and a backside surface. The semiconductor includes a first active layer having a first conductivity, a second active layer having a second conductivity opposite the first conductivity, and an intrinsic layer separating the first and second active layers. The method further includes the step of forming isolation trenches arranged to divide the photodiode into a plurality of cells. The isolation trenches have a depth to width ratio of at least 5.0. The method also includes the step of forming a via in each cell. Each via has a length to diameter ratio of at least 7.0. The method still further includes the step of forming a frontside electrical contact for each cell in electrical communication with the second active layer and the via. Each cell has a total frontside area including a cell active frontside area sensitive to light and a cell inactive frontside area not sensitive to light. The cell active frontside area forms at least 95 percent of the cell total frontside area.

BRIEF DESCRIPTION OF THE SEVERAL VIEWS OF THE DRAWINGS

The following detailed description of the preferred embodiments of the present invention will be better understood when read in conjunction with the appended drawings. For the purpose of illustrating the invention, there are shown in the drawings embodiments which are presently preferred. It is understood, however, that the invention is not limited to the precise arrangements and instrumentalities shown. In the drawings.

DETAILED DESCRIPTION OF THE INVENTION

Figure 1:
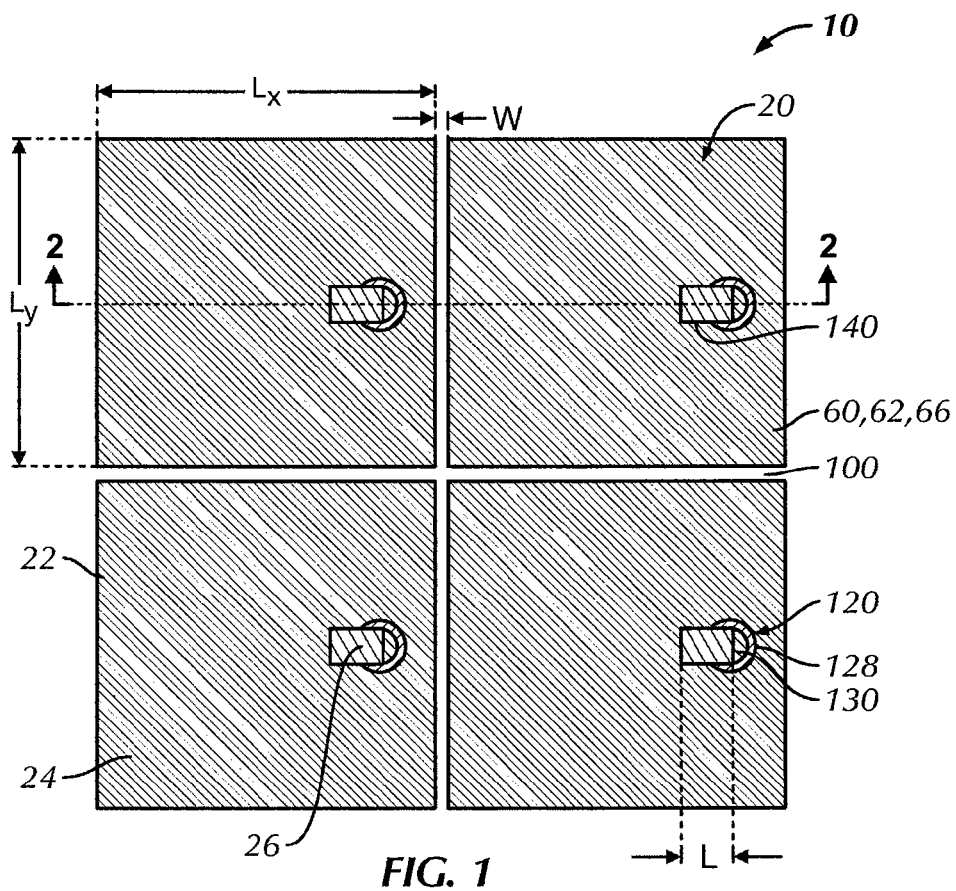
FIG. 1 is a frontside plan view of a photodiode in accordance with a preferred embodiment of the present invention, shown with peripheral and interior isolation trenches omitted and a frontside oxide layer also shown omitted.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the words "a" and "an" as used in the claims and in the corresponding portion of the specification, mean "at least one."

As used herein, reference to conductivity will reflect the embodiment illustrated and described. However, those skilled in the art know that p-type conductivity can be switched with n-type conductivity and the device would still be functionally correct. Therefore, where used herein, the artisan will recognize that p-type conductivity could be substituted where reference is made to n-type conductivity, and vice versa.

Figure 2:
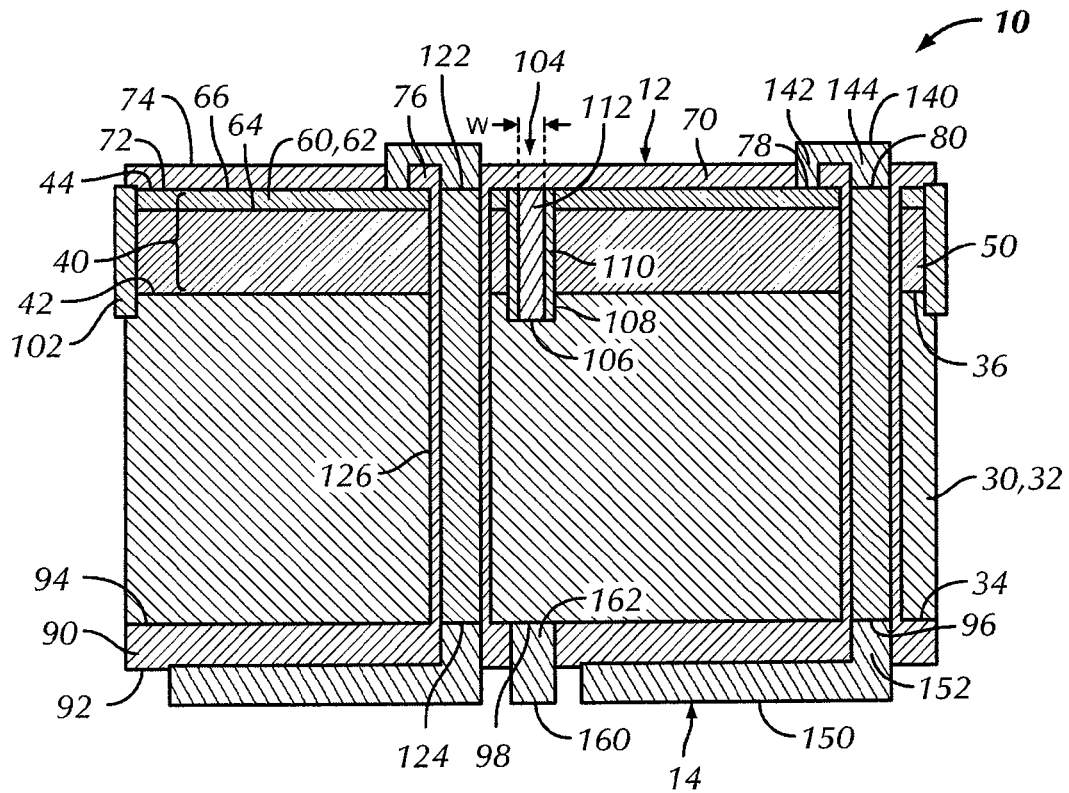
FIG. 2 is a side cross-sectional view of the photodiode of FIG. 1, taken along line 2-2 of FIG. 1.
Figure 3A:
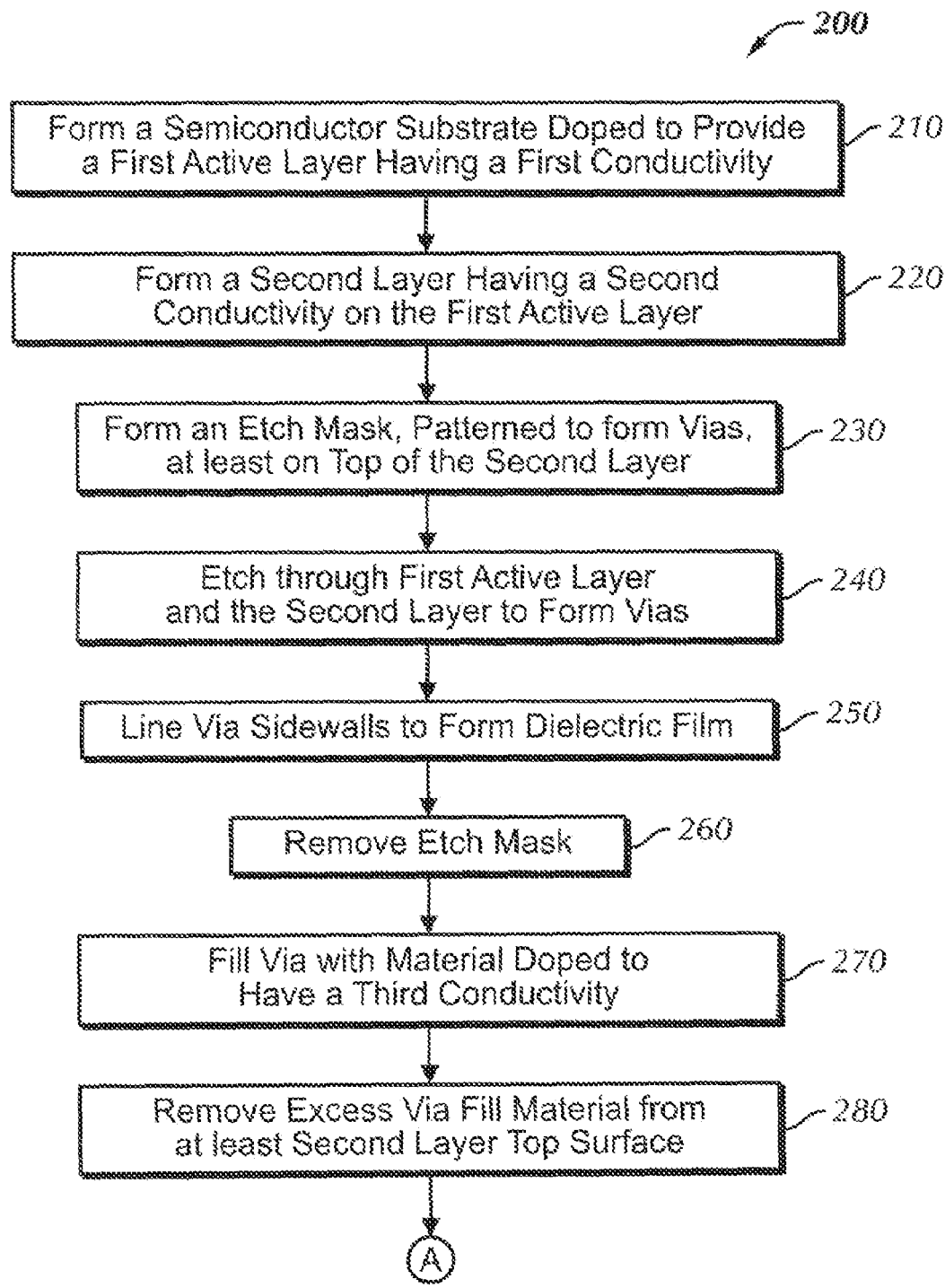
FIGS. 3A-3D are a flow diagram of steps of a manufacturing process for producing the photodiode of FIG. 1.
Figure 3B:
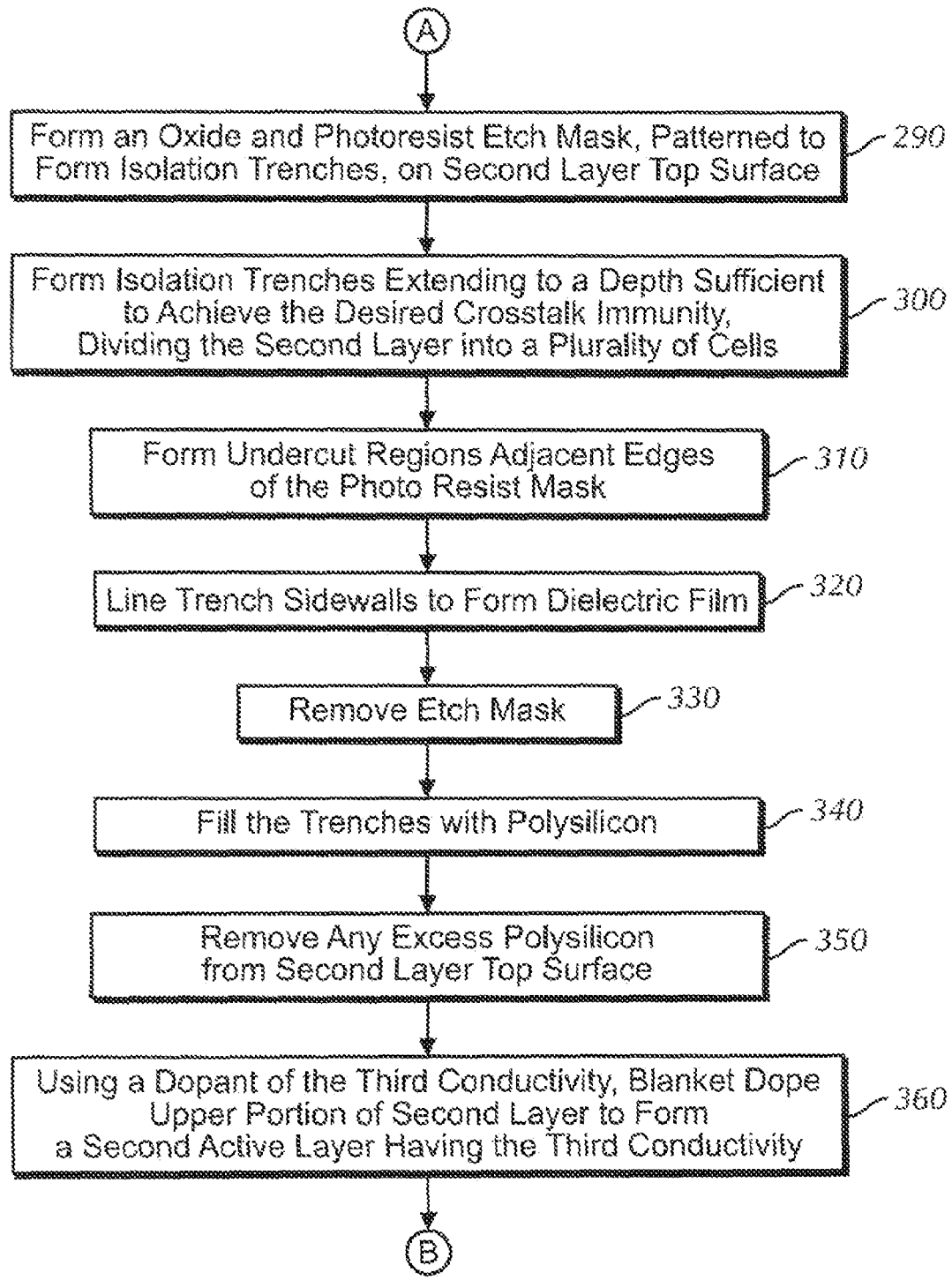
Figure 3C:
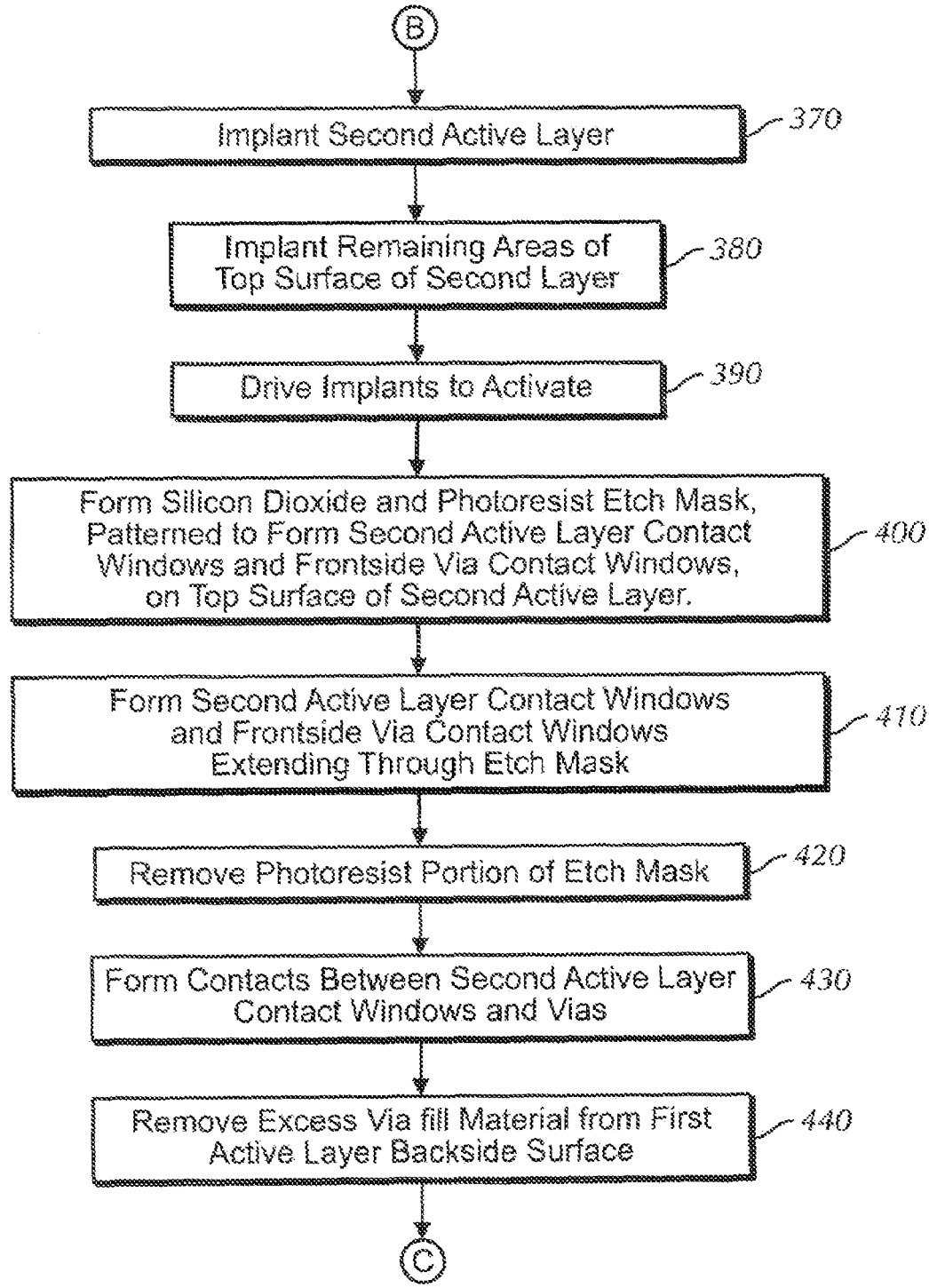
Figure 3D:
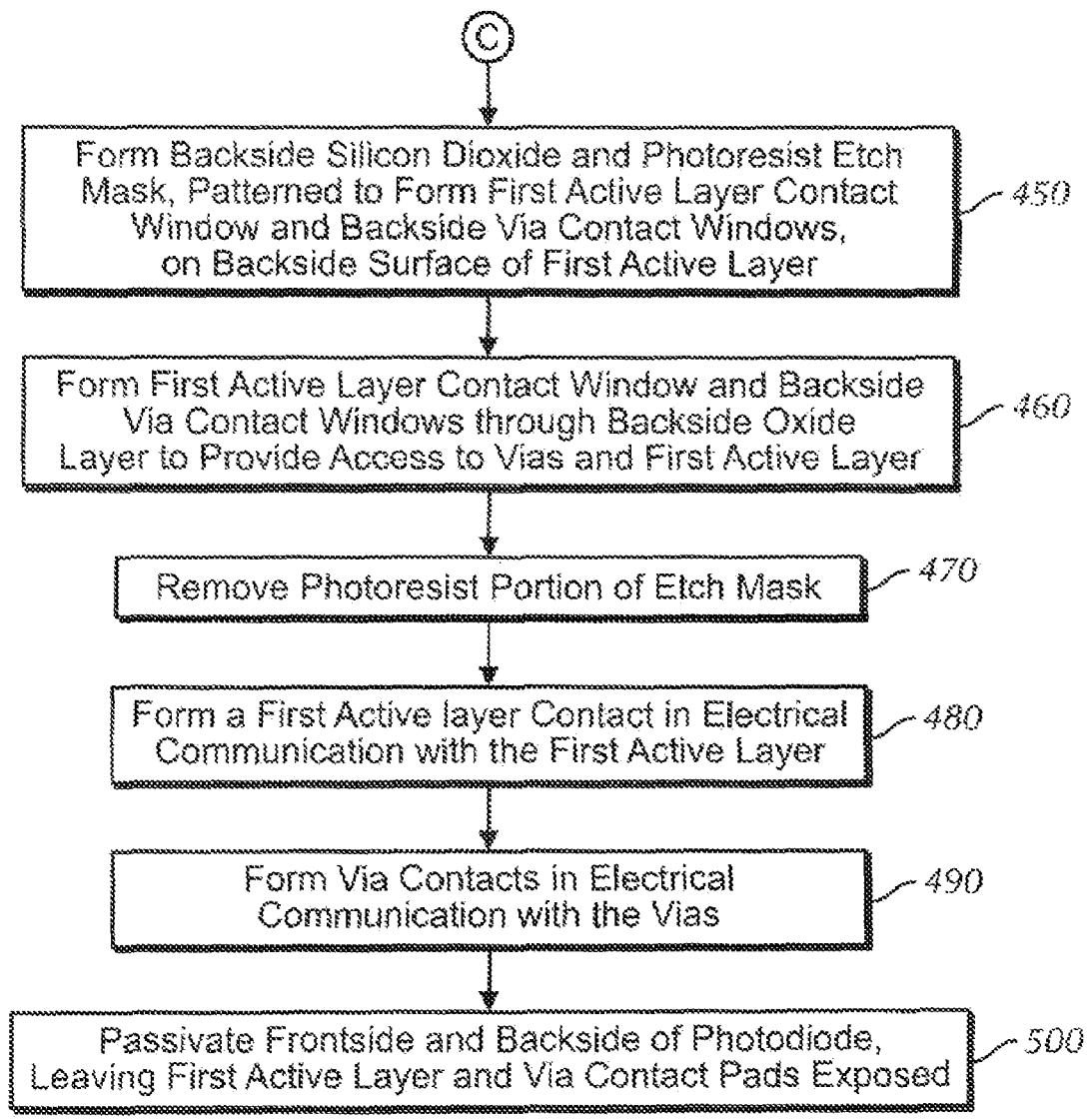

FIGS. 1 and 2 are shown at a scale greatly enlarged from the actual dimensions of the physical embodiment of the photodiode illustrated. However, relative proportions of elements of the photodiode illustrated are to shown to scale.

Referring to the drawings in detail, wherein like reference numerals indicate like elements throughout, there is shown in FIGS. 1-2 a positive-intrinsic-negative (PIN) photodiode 10 in accordance with a preferred embodiment of the present invention. The PIN photodiode 10 is preferably separated into a plurality of cells 20. Four cells 12 are illustrated in FIG. 1, although a greater or lesser number of cells 12 is possible in some applications. The photodiode 10 is a semiconductor having a light-sensitive frontside surface 12 and a backside surface 14. The photodiode 10 includes a semiconductor substrate 30 forming a first active layer 32. The first active layer 32 has a backside surface 34 and a frontside surface 36. The first active layer 32 is heavily doped with a dopant having a first conductivity. The first conductivity is preferably n-type, and the first active layer 32 preferably forms a cathode. Alternatively, the first conductivity could be p-type, and the first active layer 32 could form an anode. Preferably, the substrate 30 is formed of silicon (Si), but alternatively could be formed of other materials such as gallium arsenide (GaAs), germanium (Ge) and other suitable materials well-known in the art of semiconductor manufacture.

A second semiconductor layer 40 is formed on the substrate 20, and is subsequently processed to form an intrinsic layer 50 and a third layer 60. The second layer 40 has a backside surface 42 adjacent the first active layer frontside surface 36 and a frontside surface 44. The second layer 40 has a second conductivity, and preferably the second layer 40 is initially lightly doped with an n-type dopant. Alternatively, the second layer 40 could be formed from a semiconductor material containing substantially no impurities. In forming the third layer 60, an upper portion of the second layer 40 is more heavily doped, as described further below, leaving a lower portion of the second layer 40 to form the intrinsic layer 50, having the same doping characteristics as the initial second layer 40.

The third semiconductor layer 60 forms a second active layer 62 having a second conductivity opposite the first conductivity. The third layer 60 is formed by blanket doping the upper portion of the second layer using a dopant having a conductivity opposite to the first conductivity. Thus, preferably the conductivity of the second active layer 62 is preferably p-type, and the second active layer 62 preferably forms an anode. Alternatively, the second conductivity could be n-type, and the second active layer could form a cathode. The second active layer 62 has a backside surface 64 and a frontside surface 66 (coincident with second layer frontside surface 44). The intrinsic layer 50 separates the first and second active layers 32, 62.

Preferably, a frontside oxide layer 70 is formed on the second active layer frontside surface 66. The frontside oxide layer 70 has a backside surface 72 adjacent the second active layer frontside surface 66 and a frontside surface 74. The oxide layer 70 if provided forms a dielectric interference reflector which improves the light absorption efficiency of the photodiode 10.

Preferably, a backside oxide layer 90 is formed on the first active layer backside surface 34. The backside oxide layer 90 has a backside surface 92 and a frontside surface 94. The frontside surface 94 is adjacent the first active layer backside surface 34.

A plurality of isolation trenches 100 are formed and function at least in part to separate the photodiode 10 into the cells 20. As is known in the art of semiconductor manufacturing, the trenches 100 reduce electrical crosstalk between the cells 20. The trenches 100 are of a depth D, extending through the second active layer 62 and the intrinsic layer 50, and at least partially into the first active layer 32. Both peripheral trenches 102 and interior trenches 104 are preferably provided. The peripheral trenches 102 extend about an outer periphery of the photodiode 10. The interior isolation trenches 104 are arranged to divide the photodiode 10 into the cells 20, electrically isolating each of the cells 20 from one another. Each trench 100 includes a trench bottom 106 positioned at depth D from the second active layer frontside surface 66 and trench sidewalls 108. As discussed further below, the trench sidewalls 108 may be lined with an oxide or nitride coating to form a dielectric film 110 on the sidewalls 108. Alternatively, the sidewalls 108 could be doped with a dopant of the first conductivity to form sidewall active diffusion regions extending the isolation trench depth along each isolation trench sidewall 108. The isolation trenches 100 are filled with a material such as polysilicon 112. The interior trenches 104 have a width W. Preferably, a ratio of the depth D to the width W is at least 5.0.

Each cell 20 is provided with a via 120 for electrically connecting the second active layer 62 with a backside contact pad 150. Each via 120 is preferably circular in cross-section, having a diameter Φ. Alternatively, other cross-sectional shapes could be provided. Note that whatever cross-sectional shape is provided, an equivalent circular shape exists, having an equivalent area (and a diameter corresponding to that equivalent area).

Each via 120 has a first end 122 proximate the photodiode frontside surface 12 and a second end 124 proximate the photodiode backside surface 14, and a length extending between the first and second ends 122, 124. Preferably, the length of each of the via 120 is at least 7 times greater than the diameter (or the diameter corresponding to an equivalent circular area) of the via 120.

Via sidewalls 126 are lined with an oxide or nitride coating to form a dielectric film 128 on the sidewalls 126. The dielectric film 128 is formed of a material and with a thickness suitable for allowing the dielectric film 128 to withstand voltage differences created across the dielectric film 128. The vias 120 are filled with a conductive material 130 such as doped polysilicon, of the conductivity type of the second active layer 62 (that is, preferably p-type).

A frontside electrical contact 140 is formed on the photodiode frontside surface 12, and provides an electrical path between the second active layer 62 within a given cell 20 and the via 120 associated with that cell 20. The frontside electrical contact 140 has a first end 142 in electrical contact with the via 120, and a second end 144 in electrical contact with the second active layer 62. The frontside electrical contact 140 has a length L in a direction substantially parallel to the frontside surface and extending between the connection to the via and the connection to the second active layer. The length L is preferably no greater than three times the via diameter Φ (or the diameter corresponding to an equivalent circular cross-sectional area of the via).

In the embodiment illustrated, the frontside electrical contact first end 142 extends through a via contact window 80 formed in the frontside oxide layer 70, while the frontside electrical contact second end 144 extends through a second active layer contact window 78. Furthermore, the embodiment illustrated includes a portion 76 of the frontside oxide layer 70 positioned beneath the frontside electrical contact 140. If desired, to reduce a length of a path between the frontside electrical contact first and second ends 142, 144, the second active layer contact window 78 and the via contact window 80 could be connected to eliminate the portion 76 of the frontside oxide layer 70 positioned beneath the frontside electrical contact 140.

A second active layer backside electrical contact 150 is formed on the photodiode backside surface 14, and provides an electrical contact allowing connection of external devices (not shown). The second active layer backside electrical contact 150 has a first end 152 in electrical contact with the via second end 124. In the embodiment illustrated, the second active layer backside electrical contact first end 152 extends through a via contact window 96 formed in the backside oxide layer 90.

A first active layer backside electrical contact 160 is also formed on the photodiode backside surface 14, and also provides an electrical contact allowing connection of external devices (not shown). The first active layer backside electrical contact 160 has a first end 162 in electrical contact with the first active layer backside surface 34. In the embodiment illustrated, the first active layer backside electrical contact first end 162 extends through a first active layer contact window 98 formed in the backside oxide layer 90.

The photodiode 10 of the present invention provides a second active layer 62 having an increased proportion of light-sensitive area to light-insensitive area. In the embodiment illustrated, each cell 20 has a total frontside area equal to a length in a first direction, $L_x$, times a length in a second direction perpendicular to the first direction, $L_y$. At least 95 percent of the total cell frontside area is sensitive to light, with the remaining at most 5 percent of the total cell frontside area being inactive or insensitive to light. The cell inactive frontside area includes a via frontside area formed by the via first end 122. The cell inactive frontside area further includes a frontside area associated with the frontside electrical contact 140. The electrical contact frontside area is preferably at most 4 percent of the cell total frontside area, while the via frontside area is at most 2 percent of the cell total frontside area.

The photodiode frontside 12 has a total area including a semiconductor active area sensitive to light, equal to the sum of each cell active frontside area, and a semiconductor inactive area, insensitive to light, including each cell inactive frontside area as well as a trench inactive frontside area defined by upper surfaces of the isolation trenches 100. Preferably, the semiconductor active area forms at least 90 percent of the semiconductor total area.

With reference now to FIGS. 3A-3D, a method 200 of manufacturing the photodiode 10 is illustrated in diagrammatic form. Steps of the method 200 are designated as "first", "second", etc. for convenience only, and such nomenclature is not necessarily indicative of the order in which the steps are performed. The method 200 comprises a first step 210 of forming semiconductor substrate 20 doped to provide the first active layer 32 having a first conductivity. The substrate 20 may be formed in any number of known, conventional methods, such as float zone monocrystalline growth techniques or Czochralski (CZ) crystal growth techniques. In a second step 220, second layer 30, having a second conductivity, is formed on the substrate 20. Again, known, conventional methods may be used to form the second layer 30, such as molecular beam epitaxy or chemical vapor phase epitaxy or direct wafer bonding. In a third step 230, an etch mask (not illustrated) is formed. The etch mask is conventional, for example, a photoresist mask or a combination oxide and photoresist mask. The etch mask is patterned to form the vias 120.

Doping is performed by one of ion implantation, solid diffusion, liquid diffusion, spin-on deposits, plasma doping, vapor phase doping, laser doping or the like. Doping with boron B results in a more p-type region, doping with phosphorus P results in a more n-type region and doping with arsenic Ar results in a more n-type region. Other dopants may be utilized such as antimony Sb, bismuth Bi, aluminum Al, indium In, gallium Ga or the like depending on the material of the semiconductor substrate 20 and the desired strength of the doping.

The dopants may be applied by diffusion. The semiconductor substrate 20 is placed in a suitable diffusion chamber at about 700° C. to about 1200° C. proximate to a solid source such as boron or phosphorous. Alternatively, the semiconductor substrate 20 can be exposed to a liquid source of dopant at about 700° C. to about 1200° C.

Alternatively, the dopants may be implanted. The semiconductor substrate 20 is implanted with boron B, phosphorus P, arsenic As or the like, at a high energy level in the range of about 40 to 1000 kilo-electronvolts (KeV). Preferably, the energy level is in the range of about 200 to 1000 KeV, but it should be recognized that the energy level should be selected to sufficiently implant the dopant. Another drive in step at a temperature of up to 1200° Celsius may be performed for up to 12 hours so that implanted dopant is sufficiently driven into the substrate.

In a fourth step 240, the vias 120 are formed by a conventional etching process. For example, the vias 120 may be etched using plasma etching, Reactive Ion Etching (RIE) or chemical etching. The vias 120 may be smoothed, if needed, using processing steps such as isotropic plasma etch or deep ion etching such as deep RIE. Portions of the semiconductor substrate 20 or the entire device may have a sacrificial silicon dioxide layer grown thereon and then may be etched using a buffered oxide etch or a diluted hydrofluoric (HF) acid etch or the like to produce smooth surfaces and/or rounded corners thereby reducing residual stress and unwanted contaminants.

In a fifth step 250, the via sidewalls 126 are lined with oxide or nitride to form the sidewall dielectric film 128. Conventional deposition techniques known in the art of semiconductor manufacturing are used to form the dielectric film 128. In a sixth step 260, the etch mask is removed. In a seventh step 270, the vias 120 are filled with a material 130, such as polysilicon, doped to have the conductivity of the second active layer 62 (preferably, p-type). In an eighth step 280, excess fill material 130 is removed from at least the second layer frontside surface 44, using conventional planarization techniques.

In a ninth step 290, a conventional oxide and photoresist etch mask (not illustrated) is formed using conventional techniques on the second layer frontside surface 44. The etch mask of the ninth step 290 is patterned to form the isolation trenches 100. The isolation trenches 100 are formed in a tenth step 300 by a conventional semiconductor manufacturing process such as plasma etching, Reactive Ion Etching (RIE), or chemical etching. The trench sidewalls 108 may be smoothed, if needed, using conventional processes such as plasma etching or wet etching. The trenches 100 are formed to have a depth D. At least interior trenches 104 are formed to have a width W.

In a preferred eleventh step 310, the oxide layer (not illustrated) adjacent upper edges of the trenches 100 is etched to form undercut regions (not illustrated). The undercut regions are preferably formed using a wet etch process. In a twelfth step 320, the trench sidewalls 108 are lined with oxide or nitride to form the trench sidewall dielectric film 110. Conventional deposition techniques known in the art of semiconductor manufacturing are used to form the dielectric film 110. Alternatively, the method of manufacturing 200 could comprise a step of doping the trench sidewalls 108 with a dopant of the first conductivity to form sidewall active diffusion regions extending the isolation trench depth along each isolation trench sidewall 108.

In a thirteenth step 330, the etch mask (not shown) of ninth step 290 is removed. In a fourteenth step 340, the trenches 100 are filled with a material 112, such as undoped polysilicon. In a fifteenth step 350, excess fill material 112 is removed from at least the second layer frontside surface 44, preferably using conventional planarization techniques.

In a sixteenth step 360, an upper portion of the second layer 40 is blanket doped using a dopant of the conductivity of the second active layer 62, preferably p-type. Conventional doping techniques, including ion implantation, solid diffusion, liquid diffusion, spin-on deposits, plasma doping, vapor phase doping, and laser doping, could be used. In a seventeenth step 370, the dopant applied in the sixteenth step 360 is implanted. In an eighteenth step 380, any lightly doped areas of the photodiode frontside surface 12 not already covered by the trenches 100, vias 120, or second active layer 62 are implanted. In a nineteenth step 390, the photodiode 10 is subjected to a conventional high temperature drive-in process to activate the implanted dopants.

In a twentieth step 400, a conventional silicon dioxide and photoresist etch mask is formed on the second active layer frontside surface 66. The silicon dioxide portion of the etch mask is frontside oxide layer 70. The etch mask is patterned to form the second active layer contact windows 78 and the via contact windows 80. In a twenty-first step 410, the second active layer contact windows 78 and via contact windows 80 are formed, extending through the frontside oxide layer 70. In a twenty-second step 420, the photoresist portion of the etch mask is removed.

In a twenty-third step 430, the second active layer frontside electrical contacts 140 are formed, extending between the second active layer contact windows 78 and the via contact windows 80. The second active layer frontside electrical contacts 140 are in electrical communication with the second active layer 62 and the vias 120. The frontside electrical contacts 140 are formed using conventional techniques known in the art of semiconductor manufacturing, such as sputtering, evaporation and/or electroplating. The frontside electrical contacts 140 may be formed from conventional materials used to form electrical contacts such as aluminum, aluminum silicon, copper, gold, silver, titanium, tungsten, or nickel.

In a twenty-fourth step 440, any excess via fill material 130 is removed from the first active layer backside surface 34. In a twenty-fifth step 450, a conventional silicon dioxide and photoresist etch mask is formed on the first active layer backside surface 34. The silicon dioxide portion of the etch mask is backside oxide layer 90. The etch mask is patterned to form at least one first active layer contact window 98 and the backside via contact windows 96. In a twenty-sixth step 460, the first active layer contact window 98 and backside via contact windows 96 are formed, extending through the backside oxide layer 90. In a twenty-seventh step 470, the photoresist portion of the etch mask is removed.

In a twenty-eighth step 480, the first active layer electrical contact 160 is formed, extending from the first active layer contact window 98. The first active layer electrical contact 160 is in electrical communication with the first active layer 32. Similarly, in a twenty-ninth step 490, the second active layer backside electrical contacts 150 are formed, extending from backside via contact windows 96. The second active layer backside electrical contacts 150 are in electrical communication with the second active layer 62 through the vias 120. The first active layer electrical contact 160 and second active layer backside electrical contacts 150 are formed using conventional techniques known in the art of semiconductor manufacturing, such as sputtering, evaporation and/or electroplating. The electrical contacts 150, 160 may be formed from conventional materials used to form electrical contacts such as aluminum, aluminum silicon, copper, gold, silver, titanium, tungsten, or nickel. Finally, in a thirtieth step 500, the photodiode frontside and backside surfaces 12, 14 are passivated, leaving the first active layer and backside via contact pads 160, 150 exposed for electrical connection with external devices (not shown).

From the foregoing, it can be seen that embodiments of the present invention are directed to a photodiode having a frontside electrical contact, a via, and isolation trenches arranged so as to increase the proportion of light-sensitive frontside area of total frontside area. Embodiments of the present invention are further directed to a method of manufacturing such a photodiode. It will be appreciated by those skilled in the art that changes could be made to the embodiments described above without departing from the broad inventive concept thereof. It is understood, therefore, that the invention is not limited to the particular embodiments disclosed, but is intended to cover modifications within the spirit and scope of the present application.

We claim:

1. A photodiode having an increased proportion of light-sensitive area to light-insensitive area comprising:

a semiconductor having a backside surface and a light-sensitive frontside surface and including:
  a first active layer having a first conductivity,
  a second active layer having a second conductivity opposite the first conductivity, and
  an intrinsic layer separating the first and second active layers; and
a plurality of isolation trenches arranged to divide the photodiode into a plurality of cells, each cell having a total frontside area including a cell active frontside area sensitive to light and a cell inactive frontside area not sensitive to light, and the cell active frontside area forming at least 95 percent of the cell total frontside area.

2. The photodiode of claim 1, wherein:
the isolation trenches together define a trench inactive frontside area;
the frontside surface of the semiconductor has a total area including a semiconductor active area equal to the sum of each cell active frontside area and a semiconductor inactive area including each cell inactive frontside area and the trench inactive frontside area; and
the semiconductor active area forms at least 90 percent of the semiconductor total area.

3. The photodiode of claim 1, wherein each cell includes a via having a via frontside area forming a portion of the cell inactive frontside area and a frontside electrical contact having a electrical contact frontside area also forming a portion of the cell inactive frontside area.

4. The photodiode of claim 3, wherein the electrical contact frontside area is less than 4 percent of the cell total frontside area.

5. The photodiode of claim 3, wherein the via frontside area is less than 2 percent of the cell total frontside area.

6. The photodiode of claim 3, wherein each via has a ratio of a length of the via to a diameter of the via equal to at least 7.0.

7. The photodiode of claim 3, wherein the frontside electrical contact has a length in a direction substantially parallel to the frontside surface and extending between the via and a connection to the second active layer, the length being no greater than three times a diameter of the via.

8. The photodiode of claim 1, wherein each isolation trench has a ratio of a depth of the isolation trench to a width of the isolation trench equal to at least 5.0.

9. The photodiode of claim 1, further comprising at least one cathode contact pad and at least one anode contact pad positioned on the semiconductor backside surface.

10. The photodiode of claim 1, wherein the first conductivity is one of p-type and n-type, and the second conductivity is the other one of p-type and n-type.

11. The photodiode of claim 1, wherein the first active layer is one of cathodic and anodic and the second active layer is the other one of cathodic and anodic.

12. The photodiode of claim 1, wherein each isolation trench is substantially linear in shape along the depth of the trench and has a longitudinal axis extending in a direction of the depth.

13. The photodiode of claim 12, wherein the isolation trench longitudinal axes are substantially perpendicular to the frontside surface.

* * * * *